United States Patent  
Chakraborty et al.

(10) Patent No.: US 6,532,578 B2
(45) Date of Patent: Mar. 11, 2003

(54) METHOD OF CONFIGURING INTEGRATED CIRCUITS USING GREEDY ALGORITHM FOR PARTITIONING OF N POINTS IN P ISOTHETIC RECTANGLES

(75) Inventors: Kanad Chakraborty, Bridgewater, NJ (US); Maharaj Mukherjee, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/858,825

(22) Filed: May 16, 2001

(65) Prior Publication Data

US 2002/0174410 A1 Nov. 21, 2002

(51) Int. Cl.⁷ .............................................. G06F 17/50
(52) U.S. Cl. ......................................................... 716/7
(58) Field of Search ............................... 716/7, 2, 5, 8

(56) References Cited

U.S. PATENT DOCUMENTS

| | | |
|---|---|---|
| 4,908,772 A | 3/1990 | Chi |
| 5,040,133 A | 8/1991 | Feintuch et al. |

(List continued on next page.)

OTHER PUBLICATIONS

P.K. Agarwal, M. Sharir, E. Welzl; *The Discrete 2–Center Problem*; Proceedings of the 13th International Annual Symposium on Computational Geometry, pp. 147–155, Jun. 4–6, 1997.

(List continued on next page.)

Primary Examiner—Tom Thomas
Assistant Examiner—Douglas W. Owens
(74) Attorney, Agent, or Firm—DeLio & Peterson LLC; Peter W. Peterson; H. Daniel Schnurmann

(57) ABSTRACT

A method of configuring partitions for different circuit or other operational areas on an integrated circuit initially identifies points representing components of an integrated circuit with respect to a coordinate system having a horizontal axis and a vertical axis, and subsequently creates a first isothetic rectangular partition containing all of the identified points of the integrated circuit. The method then continues by subdividing the first isothetic rectangular partition with respect to the horizontal axis by creating a plurality of isothetic rectangular sub-partitions collectively containing all of the identified points of the integrated circuit. Each of the isothetic rectangular sub-partitions is separated by a line parallel to the horizontal axis. These isothetic rectangular sub-partitions collectively encompass a minimum area containing all of the identified points. The method also includes subdividing the first isothetic rectangular partition with respect to the vertical axis by creating a plurality of isothetic rectangular sub-partitions collectively containing all of the identified points of the integrated circuit. Each of the isothetic rectangular sub-partitions is separated by a line parallel to the vertical axis. These isothetic rectangular sub-partitions collectively encompass a minimum area containing all of the identified points. The method then includes comparing the collective area of the isothetic rectangular sub-partitions subdivided with respect to the horizontal axis to the collective area of the isothetic rectangular sub-partitions subdivided with respect to the vertical axis, and determining which of the horizontally divided or vertically divided isothetic rectangular sub-partitions have the smaller area. The method includes configuring the operational area on the integrated circuit in conformance with the isothetic rectangular sub-partitions determined to have the smaller area.

23 Claims, 9 Drawing Sheets

U.S. PATENT DOCUMENTS

| | | | |
|---|---|---|---|
| 5,056,045 A | | 10/1991 | Ohsawa |
| 5,771,045 A | | 6/1998 | Ghavam et al. |
| 5,898,597 A | | 4/1999 | Scepanovic et al. |
| 5,926,632 A | * | 7/1999 | Kawaguchi ............ 395/500.08 |
| 6,067,409 A | | 5/2000 | Scepanovic et al. |
| 6,088,511 A | | 7/2000 | Hardwick |
| 6,249,902 B1 | * | 6/2001 | Igusa et al. .................... 716/10 |
| 2002/0133798 A1 | * | 9/2002 | Teig et al. ..................... 716/10 |

OTHER PUBLICATIONS

S. Bespamyatnikh, D. Kirkpatrick; *Rectilinear 2–Center Problems*; Proc. Canadian Conference of Computational Geometry; pp. 68–71; 1999.

P.S. Dasgupta, A. Sen, S.C. Nandy, B.B. Bhattacharya; *Geometric Bipartitioning Problem and its Application to VLSI*; Proceedings of the IEEE International Conference on VLSI Design; pp. 400–405, Jan. 3–6, 1996.

J.M. Ho, M.T. Ko; *Bounded Fan–Out M–Center Problem*; Information Processing Letters 63; pp. 103–108; Jul. 1997.

N.D. Hasan, Y. Relis, and P.D. Vandyke; *Floorplanning Using Hierarchical Rules*; IBM Technical Disclosure Bulletin, vol. 40, No. 1, pp. 225–227; Jan. 1997.

T. Izumi, A. Takahashi, Y. Kajatani; *Air–Pressure Model and Fast Algorithms for Zero–Wasted–Area Layout of General Floorplan*; TIEICE:IEICE Transactions on Communications/Electronics/ Information and Systems, vol. E81–A, No. 5, pp. 857–865; May 1998.

H. Kapadia, M. Horowitz; *Using Partitioning to Help Convergence in the Standard–Cell Design Automation Methodology*; Proceedings of the ACM/IEEE Design Automation Conference; pp. 592–597; 1999.

A.B. Kahng, G. Robbins, A. Singh, A. Zelikovsky; *Filling Algorithms and Analyses for Layout Density Control*; IEEE Transactions on Computer–Aided Design of Integrated Circuits and Systems, vol. 18, No. 4; pp. 445–461; Apr. 1999.

W.K. Luk, M.I. Tamminen, C.K. Wong; *Optimal Algorithm for Finding Minimial Height Binary Slicing Tree for VLSI Chip Design*; IBM Technical Disclosure Bulletin, vol. 30, No. 7; pp. 247–250, Dec. 1987.

W.K. Luk, P. Sipala, M.I. Tamminen, C.K. Wong, L.S. Woo; *Optimal Algorithm for Determining Slicing Structure Placement of Circuit Chips*; IBM Technical Disclosure Bulletin, vol. 30, No. 1; pp. 276–281; Jun. 1987.

U. Manber; *Designing Algorithms Incrementally: Finding Powerful Problem–Solving Techniques*; Dr. Dobb's Journal of Software Tools, 8 pages; Apr. 1999.

N. Megiddo, K.J. Supowitz; *On The Complexity of Some Common Geometric Location Problems*; Society For Industrial and Applied Mathematics, vol. 13, No. 1.; Feb. 1984.

M. Sharir; *A Near Linear Algorithm for the Planar 2–Center Problem*; Proceedings of the Twelfth Annual Symposium on Computational Geometry (ISG '96); pp. 1–11; Jun. 1996.

M. Sharir, E. Welzl; *Rectilinear and Polygonal p–Piercing and p–Center Problems*; Proceedings of the Twelfth Annual Symposium on Computational Geometry (ISG '96); pp. 1–11; May 1996.

G. Vijayan; *Partitioning Logic to Optimize Routability on Graphic Structures*; IEEE; pp. 2683–2641; 1990.

C.W. Yeh, C.K. Cheng, T.T. Lin; *An Experimental Evaluation of Partitioning Algorithms*; IEEE; pp. 14–1.1—14–1.4; 1991.

C. Yeh, C.K. Cheng, T.T. Lin; *A General Purpose, Multiple–Way Partitioning Algorithm*; IEEE Transactions on Computer–Aided Design of Integrated Circuits and Systems; pp. 1480–1488; Dec. 1994.

S. Bespamyatnikh, M. Segal; *Rectilinear Static and Dynamic Discrete 2–center Problems*; Lecture Notes in Computer Science, 1663:276–285, 1999.

M. Hoffman; *A Simple Linear Algorithm for Computing Rectangular 3–Centers*; Proc. Canadian Conference of Computational Geometry, 7 pages, 1999.

A. B. Kahng, G. Robins, A. Singh, H. Wang, A. Zelikovsky; *Filling and Slotting: Analysis and Algorithms*; Proceedings of the International Symposium on Physical Design (ISPD–1998), pp. 95–102.

T. Kohonen; *Self–Organization and Associative Memory*; Biological Cybernetics, 43:59–61, pp. 118–157.

T. Lengauer; *Combinatorial Algorithms for Integrated Circuit Layout*; B. G. Teubner, Stuttgart, 1990, pp. 250–301.

N. Sherwani, *Algorithms for VLSI Physical Design Automation*; $2^{nd}$ Edition, Kluwer Academic Publishers; 1995, pp. 125–157.

San–Yuan Wu, Sartaj Sahni; *Fast Algorithms to Partition Simple Rectilinear Polygons*; VLSI Design 1(3):193–215, 1994, pp. 1–38.

P.K. Agarwal, M. Sharir, E. Welzl; *The Discrete 2–Center Problem*; Proceedings of the $13^{th}$ International Annual Symposium on Computational Geometry, pp. 147–155, Jun. 4–6, 1997.

S. Bespamyatnikh, D. Kirkpatrick; *Rectilinear 2–Center Problems*; Proc. Canadian Conference of Computational Geometry; pp. 68–71; 1999.

P.S. Dasgupta, A. Sen, S.C. Nandy, B.B. Bhattacharya; *Geometric Bipartitioning Problem and its Applications to VLSI*; Proceedings of the IEEE International Conference on VLSI Design; pp. 400–405, Jan. 3–6, 1996.

J.M. Ho, M.T. Ko; *Bounded Fan–Out M–Center Problem*; Information Processing Letters 63; pp. 103–108; Jul. 1997.

N.D. Hasan, Y . Relis, and P.D. Vandyke; *Floorplanning Using Hierarchical Rules*; IBM Technical Disclosure Bulletin, vol. 40, No. 1, pp. 225–227; Jan. 1997.

T. Izumi, A. Takahashi, Y. Kajatani; *Air–Pressure Model and Fast Algorithms for Zero–Wasted–Area Layout of General Floorplan*; TIEICE:IEICE Transactions on Communications/Electronics/ Information and Systems, vol. E81–A, No. 5, pp. 857–865; May 1998.

H. Kapadia, M. Horowitz; *Using Partitioning to Help Convergence in the Standard–Cell Design Automation Methodology*; Proceedings of the ACM/IEEE Design Automation Conference; pp. 592–597; 1999.

A.B. Kahng, G. Robbins, A. Singh, A. Zelikovsky; *Filling Algorithms and Analyses for Layout Density Control*; IEEE Transactions on Computer–Aided Design of Integrated Circuits and Systems, Vol. 18, No. 4; pp. 445–461; Apr. 1999.

W.K. Luk, M.I. Tamminen, C.K. Wong; *Optimal Algorithm for Finding Minimal Height Binary Slicing Tree for VLSI Chip Design*; IBM Technical Disclosure Bulletin, vol. 30, No. 7; pp. 247–250, Dec. 1987.

W.K. Luk, P. Sipala, M.I. Tamminen, C.K. Wong, L.S. Woo; *Optimal Algorithm for Determining Slicing Structure Placement of Circuit Chips*; IBM Technical Disclosure Bulletin, vol. 30, No. 1; pp. 276–281; Jun. 1987.

U. Manber; *Designing Algorithms Incrementally: Finding Powerful Problem–Solving Techniques*; Dr. Dobb's Journal of Software Tools, 8 pages; Apr. 1999.

N. Megiddo, K.J. Supowitz; *On The Complexity of Some Common Geometric Location Problems*; Society For Industrial and Applied Mathematics, vol. 13, No. 1.; Feb. 1984.

M. Sharir; *A Near Linear Algorithm for the Planar 2–Center Problem*; Proceedings of the Twelfth Annual Symposium on Computational Geometry (ISG '96); pp. 1–11; Jun. 1996.

M. Sharir, E. Welzl; *Rectilinear and Polygonal p–Piercing and P–Center Problems*; Proceedings of the Twelfth Annual Symposium on Computational Geometry (ISG '96); pp. 1–11; May 1996.

G. Vijayan; *Partitioning Logic to Optimize Routability on Graphic Structures*; IEEE; pp. 2683–2641; 1990.

C.W. Yeh, C.K. Cheng, T.T. Lin; *An Experimental Evaluation of Partitioning Algorithms*; IEEE; pp. 14–1.1—14–1.4; 1991.

C. Yeh, C.K. Cheng, T.T. Lin; *A General Purpose, Multiple–Way Partitioning Algorithm*; IEEE Transactions on Computer–Aided Design of Integrated Circuits and Systems; pp. 1480–1488; Dec. 1994.

\* cited by examiner

METHOD OF CONFIGURING INTEGRATED CIRCUITS USING GREEDY ALGORITHM FOR PARTITIONING OF N POINTS IN P ISOTHETIC RECTANGLES

BACKGROUND OF THE INVENTION

1. Field of the Invention

The present invention relates to the design of integrated circuits and, in particular, to configuring partitions for locating different circuit or other operational areas on an integrated circuit.

2. Description of Related Art

Design automation of complex VLSI (very large scale integrated) chips is typically associated with long design turnaround time, which, in turn, increases the time-to-market. Two reasons for this large turnaround time problem are slowness of the algorithms, caused by large problem sizes (e.g., hundreds of millions of circuits and nets on a chip); and large number of iterations between different algorithms required to converge to an acceptable solution. Current design tools are reaching their limits of efficiency and speed as the number of circuit components such as transistors, diodes, capacitors, resistors, and the like increase exponentially every year and the complexity of their connectivity increases in quadratic terms of the number of components.

A popular approach towards improving the speed of VLSI design-automation algorithms is partitioning. Partitioning helps the developers of the VLSI design-automation tools to optimize the design parameters within each partition locally. Typically, circuit netlists modeled as hypergraphs are partitioned using various heuristics that have been known to give good results, both in terms of runtime and quality of results.

In the geometric design of VLSI circuits, it is customary to represent circuit components such as terminals, connector corners and vias as a set of points in the X-Y plane. The point set representation of geometric circuits allows the tool developer to concentrate on the underlying geometric relationship among different components rather than their synthetic connectivity relationship as ordained by the circuit designers. One of the major critical issues in any type of partitioning scheme in the development of VLSI design-automation algorithm is the chip real estate. Since the number of components is very large, and the space they occupy is always at premium, it would be advantageous to minimize the total area of the partitions. Normally, there exists an upper bound on the number of such partitions that can be used to solve a particular problem since, as the number of partitions increases, the complexity of the algorithm(s) increases with it. The number of partitions may be determined by the designer on the basis of design constraints.

Bearing in mind the problems and deficiencies of the prior art, it is therefore an object of the present invention to provide an improved method and system for designing and configuring partitions on an integrated circuit or other substrate.

It is another object of the present invention to improve the speed of VLSI design-automation algorithms in partitioning integrated circuits.

A further object of the invention is to provide an improved method and system for creating integrated circuit partitions that minimizes the total area of the partitions.

It is yet another object of the present invention to provide a method of partition design automation which is especially useful for complex very large scale integrated circuit chips.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of configuring partitions for different circuit or other operational areas on an integrated circuit comprising initially identifying points representing components of an integrated circuit with respect to a coordinate system having a horizontal axis and a vertical axis, and subsequently creating a first isothetic rectangular partition containing all of the identified points of the integrated circuit. The isothetic rectangular partition has sides parallel to the horizontal axis and the vertical axis. The method then continues by subdividing the first isothetic rectangular partition with respect to the horizontal axis by creating a plurality of isothetic rectangular sub-partitions collectively containing all of the identified points of the integrated circuit. Each of the isothetic rectangular sub-partitions contain at least two points not aligned in parallel to the horizontal axis, and each of the isothetic rectangular sub-partitions is separated by a line parallel to the horizontal axis. These isothetic rectangular sub-partitions collectively encompass a minimum area containing all of the identified points. The method also includes subdividing the first isothetic rectangular partition with respect to the vertical axis by creating a plurality of isothetic rectangular sub-partitions collectively containing all of the identified points of the integrated circuit. Each of the isothetic rectangular sub-partitions contain at least two points not aligned in parallel to the vertical axis, and each of the isothetic rectangular sub-partitions is separated by a line parallel to the vertical axis. These isothetic rectangular sub-partitions collectively encompass a minimum area containing all of the identified points. The method then includes comparing the collective area of the isothetic rectangular sub-partitions subdivided with respect to the horizontal axis to the collective area of the isothetic rectangular sub-partitions subdivided with respect to the vertical axis, and determining which of the horizontally divided or vertically divided isothetic rectangular sub-partitions have the smaller area. Once this is accomplished, the method then includes configuring the operational area on the integrated circuit in conformance with the isothetic rectangular sub-partitions determined to have the smaller area.

Preferably, subdividing the first isothetic rectangular partition with respect to the horizontal or vertical axis is by creating a plurality of sets of two isothetic rectangular sub-partitions. The isothetic rectangular sub-partitions in each set is separated by a line parallel to either the horizontal axis or the vertical axis, respectively, and collectively contain all of the identified points of the integrated circuit. For each set, there is determined the total area of the isothetic rectangular sub-partitions in the set, and the set of isothetic rectangular sub-partitions having the smallest total area is selected.

The set of isothetic rectangular sub-partitions having the smallest total area may be selected with respect to the horizontal axis and a set of isothetic rectangular sub-partitions having the smallest total area may be selected with respect to the vertical axis, so that the selected sets are compared to determine which of the horizontally divided or vertically divided isothetic rectangular sub-partitions have the smaller area.

Preferably, the two isothetic rectangular sub-partitions created in each set do not intersect. The method may further include partitioning at least one of the isothetic rectangular sub-partitions in the set determined to have the smaller area by creating a plurality of subsets of two isothetic rectangular sub-partitions. The isothetic rectangular sub-partitions in each subset are separated by a line parallel to either the horizontal axis or the vertical axis and collectively contain all of the identified points of the isothetic rectangular sub-partition being further partitioned. The method then includes, for each subset, determining the total area of the isothetic rectangular sub-partitions in the subset, and selecting the subset of isothetic rectangular sub-partitions having the smallest total area.

The further partitioning may be continued on one or more isothetic rectangular sub-partitions until a desired number of isothetic rectangular sub-partitions having the smallest total area are selected. Preferably, only isothetic rectangular sub-partitions containing at least four identified points are partitioned.

The method step of subdividing the isothetic rectangular partition with respect to the horizontal or vertical axis may be practiced by scanning the identified points with a line parallel to the horizontal axis or a line parallel to the vertical axis, respectively, and, for different scanning line positions, creating a set of two separate, non-intersecting isothetic rectangular boxes on either side of the line collectively containing all of the identified points.

In a preferred embodiment, the method includes calculating the difference in area between the first isothetic rectangular partition containing all of the identified points of the integrated circuit with the collective area of the isothetic rectangular sub-partitions subdivided with respect to the horizontal axis, and calculating the difference in area between the first isothetic rectangular partition containing all of the identified points of the integrated circuit with the collective area of the isothetic rectangular sub-partitions subdivided with respect to the vertical axis. In this manner there is determined which of the horizontally divided or vertically divided isothetic rectangular sub-partitions have the smaller area.

The identified points may represent components of an integrated circuit selected from the group consisting essentially of terminals, connector corners and vias. The operational area on the integrated circuit may be configured to create a local net in each of the selected rectangular sub-partitions, a fill pattern in each of the selected rectangular sub-partitions, or a local area of similar power supply voltage in each of the selected rectangular sub-partitions.

In another aspect, the present invention relates to a method of locating circuit areas on an integrated circuit comprising initially identifying points representing components of an integrated circuit with respect to a coordinate system having a horizontal axis and a vertical axis, and then creating a first isothetic rectangular partition containing all of the identified points of the integrated circuit, the isothetic rectangular partition having sides parallel to the horizontal axis and the vertical axis. The method continues by scanning the identified points with a line parallel to the horizontal axis, and, for different horizontal scanning line positions, creating a set of two separate, non-intersecting isothetic rectangular sub-partitions on either side of the line collectively containing all of the identified points. The total area of each set of isothetic rectangular sub-partitions created at each horizontal scanning line position is measured, and the set of horizontally scanned isothetic rectangular sub-partitions having the smallest total area is selected. The method also includes scanning the identified points with a line parallel to the vertical axis, and, for different vertical scanning line positions, creating a set of two separate, non-intersecting isothetic rectangular sub-partitions on either side of the line collectively containing all of the identified points. The total area of each set of isothetic rectangular sub-partitions created at each vertical scanning line position is measured, and the set of vertically scanned isothetic rectangular sub-partitions having the smallest total area is selected. The method then compares the set of horizontally scanned isothetic rectangular sub-partitions having the smallest total area to the set of vertically scanned isothetic rectangular sub-partitions having the smallest total area and determines the set of scanned isothetic rectangular sub-partitions having the smaller area. The method then provides for locating circuit areas on the integrated circuit in conformance with the set of scanned isothetic rectangular sub-partitions determined to have the smaller area.

Preferably, each of the two horizontal scan line-created isothetic rectangular sub-partitions contains at least two points not aligned in parallel to the horizontal axis and each of the two vertical scan line-created isothetic rectangular sub-partitions contains at least two points not aligned in parallel to the vertical axis. More preferably, the method determines a first generation set of scanned isothetic rectangular sub-partitions having minimum area, and further repeats the steps on the scanned isothetic rectangular sub-partitions to create one or more subsequent generation sets of scanned isothetic rectangular sub-partitions having minimum area. In this case, the method locates circuit areas on the integrated circuit in conformance with a subsequent generation set of scanned isothetic rectangular sub-partitions determined having minimum area.

Preferably, only isothetic rectangular sub-partitions containing at least four identified points are scanned. The preferred method may include calculating the difference in area between the first isothetic rectangular partition containing all of the identified points of the integrated circuit with the collective area of the scanned isothetic rectangular sub-partitions to select the set of scanned isothetic rectangular sub-partitions having the smallest total area.

In a further aspect, the present invention provides a computer program product comprising a computer usable medium having computer readable program code means embodied therein for configuring partitions for different circuit or other operational areas on an integrated circuit. The computer readable program code means in the computer usable medium comprises computer readable program code means for practicing the method steps identified above.

In yet another aspect, the present invention provides a program storage device readable by a machine, tangibly embodying a program of instructions executable by the machine to perform method steps for configuring partitions for different circuit or other operational areas on an integrated circuit. The method steps comprise those previously recited above.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1C:
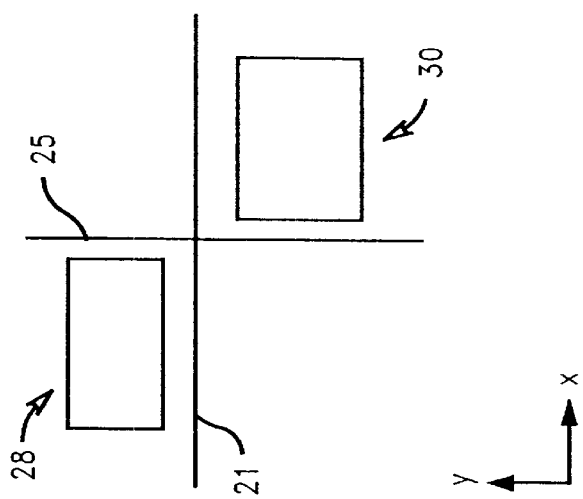
FIG. 1c is a top plan view of a partition of two isothetic rectangular areas separated by a line parallel to the horizontal axis and a line parallel to the vertical axis of the coordinate system.

In describing the preferred embodiment of the present invention, reference will be made herein to FIGS. 1–14 of the drawings in which like numerals refer to like features of the invention. Features of the invention are not necessarily shown to scale in the drawings.

The present invention describes a novel technique particularly useful for physical design of VLSI circuits by partitioning a set of points in a two-dimensional plane into a set of pre-given number of rectangles. The number of such rectangles can be defined a priori by the designer. The rectangles are called isothetic rectangles because their sides are parallel to the X and Y axes of the coordinate system.

The method and system of the present invention may be applied to various electronic design automation problems, such as the design of high fan out nets, congestion and net length analysis, insertion of fill geometries for very deep sub-micron technology, grouping of multiple power supplies and other facility location problems in the design and configuration of integrated circuits. These different types of problems are described in more detail below.

Design of high fanout nets: In the VLSI design the connectors that connect several circuit components are often grouped as nets. Often one input of the net is connected to several outputs. The number of such outputs are called fanouts. Nets with high fanout, such as clock nets, need specially designed buffer trees to drive all the sinks so as not to cause any timing problems, such as large delays, and/or electrical problems, such as violation of driven capacitance limits. A design automation algorithm for generating buffer trees for nets can be made significantly faster if the pin locations of nets can be grouped into local regions and the number of such regions can be bounded above by a constant k. Without such information, the buffer tree algorithm would look all over the chip image for the pins of a net and would, therefore, be extremely slow.

Congestion and net length analysis: Congestion and net length analyses of the circuit layout is usually preformed before using the detailed wiring tool. Wiring of a layout is extremely computation-intensive; it is imperative that wiring-congested areas or hot spots in the layout be fixed by the placement program itself, prior to wiring. A major cause of congestion problems in a layout is the presence of long wires with multiple pins. For tracking the net lengths of these long wires and identifying the regions that suffer from high wiring congestion, it is necessary to compute for each of these nets a set of regions, preferably of rectangular configuration, of minimum total area that enclose all the pins. The number of such rectangular areas is normally bounded from above by a predetermined maximum number of regions.

Inserting fill geometries for very deep sub-micron technology: For very deep sub-micron VLSI circuits, layout post process involves insertion of fill geometries in order to satisfy certain manufacturability criteria. Such fill geometries include both functional components spaced to fill a chip area uniformly, as well as non-functional dummy shapes provided only for ease of lithographic processing. The present invention solves this problem by plotting a set of points in the layout region that need to be covered by rectangular fill patterns, and then minimizing the total area of fill patterns that are needed. The number of such filled rectangles may typically be bounded above by the mask inspection and manufacturability constraints.

Grouping of multiple power supplies: In most modern VLSI circuits several power supplies are used with differences in voltages. It is necessary to localize the terminals with the same voltages to minimize interference and crosstalk between the signal and power buses. The number of these local partition depends on the number of carious power supplies used in the circuit. If the two areas that are geometrically apart uses the same power supply, then also the designers tries to separate these regions locally.

Each of these problems described above may be efficiently solved by partitioning in accordance with the present invention. The number of partitions is normally predetermined and fixed a priori, and the partitioning focuses on dividing a set of points into a group of rectilinear regions. For example, in the case of grouping of multiple power supplies, a point would refer to the terminal connected to a power supply.

In accordance with the present invention, a solution is provided for the integrated circuit partitioning problem which may be initially described as follows: Given a set of n points on the X-Y plane and some integer p, partition the n points into p isothetic rectangles, i.e., sides parallel to the X and Y axes, so that the rectangles do not intersect and the total areas of the rectangles are minimized. For example, one may consider the set of 10 points (i.e., n=10) are to be partitioned into 4 rectangles (i.e., p=4). The present invention provides a greedy algorithm that finds a solution to this problem. A greedy algorithm refers to a type of optimization algorithm that seeks to optimize each factor in each step, so that eventually the optimal solution is reached.

The method of the present invention begins by finding the single smallest isothetic rectangle that encloses all the given points, referred to as the bounding box. In the next step the bounding box is divided into two non-intersecting rectangles so that the total area of the two rectangles is minimized. In each step of the method, the rectangles generated by the previous step are considered. One rectangle from the previous step is taken at a time, and divided into two rectangles. The rest of the rectangles are left as-is, until it is their turn for division. If one has k rectangles from the previous step, one of them is divided into two so there will be k+1 rectangles. Since each of the k rectangles is considered, there will be k sets of k+1 rectangles after they are each divided into two the rest are left undivided. The one set among these k sets of k+1 rectangles which has the minimum total area is selected as the best set.

For example, suppose after the third step (k =3) there are three non-intersecting rectangles A, B, and C. At the fourth step (k+1=4) the best partition is determined that would give four non-intersecting rectangles. To do that, each of the rectangles A, B, and C are partitioned into two non-intersecting rectangles, while keeping the other two the same. First, rectangle A is partitioned to $A_1$ and $A_2$ respectively, and one would compare the four rectangles $A_1$, $A_2$, B and C. Next rectangle B is partitioned and one would compare the four rectangles A, $B_1$, $B_2$ and C. Finally, rectangle C is partitioned and one would compare another set of four rectangles, A, B, $C_1$ and $C_2$. Therefore, after these partitions one would have 3 (k=3) sets of 4 (k+1=4) rectangles: i)$A_1$, $A_2$, B and C; ii) A, $B_1$, $B_2$ and C; and iii) A, B, $C_1$ and $C_2$. The best set of rectilinear partitions, i.e., the one with the smallest area among these three set of rectangles, is then selected in this fourth step. Since the k rectangles are non-intersecting, and the k+1th rectangle is generated by dividing one of the k rectangles into two non-intersecting rectangles, the resulting k+1th rectangles is also non-intersecting. In each step of the method, an extra rectangle is added to the set. Therefore, after p such steps, there will be p non-intersecting rectangles.

The method and system of the present invention may be efficiently utilized to solve the aforementioned rectilinear p-partition of n points. In the simplest case of p=1, the output is the smallest bounding box that contains all the n points. The corners of the bounding box are the extremal points of a Hanan grid. The lower left hand corner of the bounding box is given as the smallest X and smallest Y-coordinates among the given n points, and the upper right hand corner of the bounding box is the largest X and largest Y-coordinates among the given points. The solution for p=1 may be used to obtaining a solution for the rectilinear p-partition of n points problem for p=2.

As explained previously, at the kth step, each of the k−1 rectangles are partitioned into two non-intersecting rectangles. In practice, the points contained within the former rectangle are partitioned into two rectangles containing all the points, while minimizing the total area of both the rectangles. This problem of the 2-partition may be defined as follows: Given a set of n points on the two-dimensional plane, divide the points into two non-intersecting rectangles so that the total area of the two rectangles is minimized.

Figure 1B:
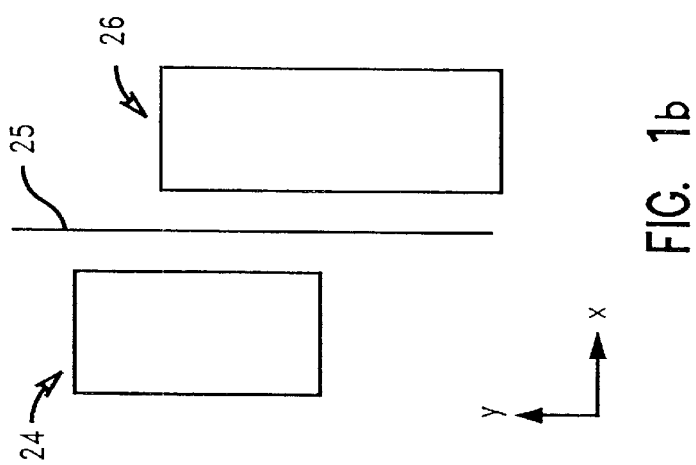
FIG. 1b is a top plan view of a partition of two isothetic rectangular areas separated by a line parallel to the vertical axis of the coordinate system.
Figure 1A:
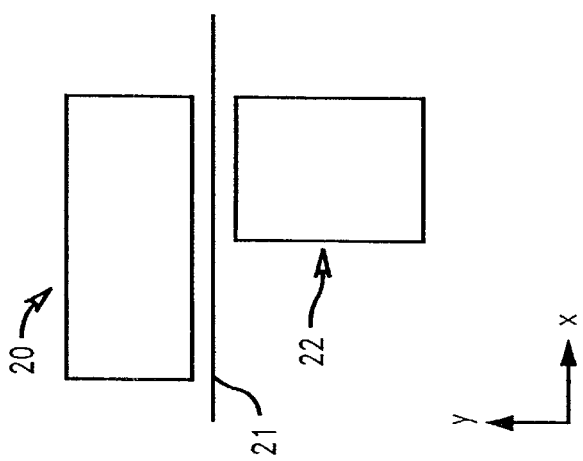
FIG. 1a is a top plan view of a partition of two isothetic rectangular areas separated by a line parallel to the horizontal axis of the coordinate system.

In accordance with the preferred embodiment of the present invention, the set of two non-intersecting, rectangles are partitioned into two regions separated by either a horizontal line or a vertical line, or both, completely dividing the whole 2-dimensional plane into two halves. For example, in FIG. 1a there are shown two rectangles 20, 22 that are separable by a horizontal line 21, but not by a vertical line. In FIG. 1b there are shown two rectangles 24, 26 that are separable by a vertical line 25, but not by a horizontal line. In FIG. 1c there are shown two rectangles 28, 30 that are separable both by a vertical line 25 and by a horizontal line 21. In each instance there always exists either a vertical or a horizontal line, or both, that can separate the rectangles completely. The method of the present invention separates the given n points of the previous rectangle by a horizontal line into two regions, and then repeats the separation of the n points of the previous rectangle by a vertical line into two regions. In each instance there is determined the smallest bounding box (isothetic rectangle) for each set of points to form the two rectangles.

Figure 5:
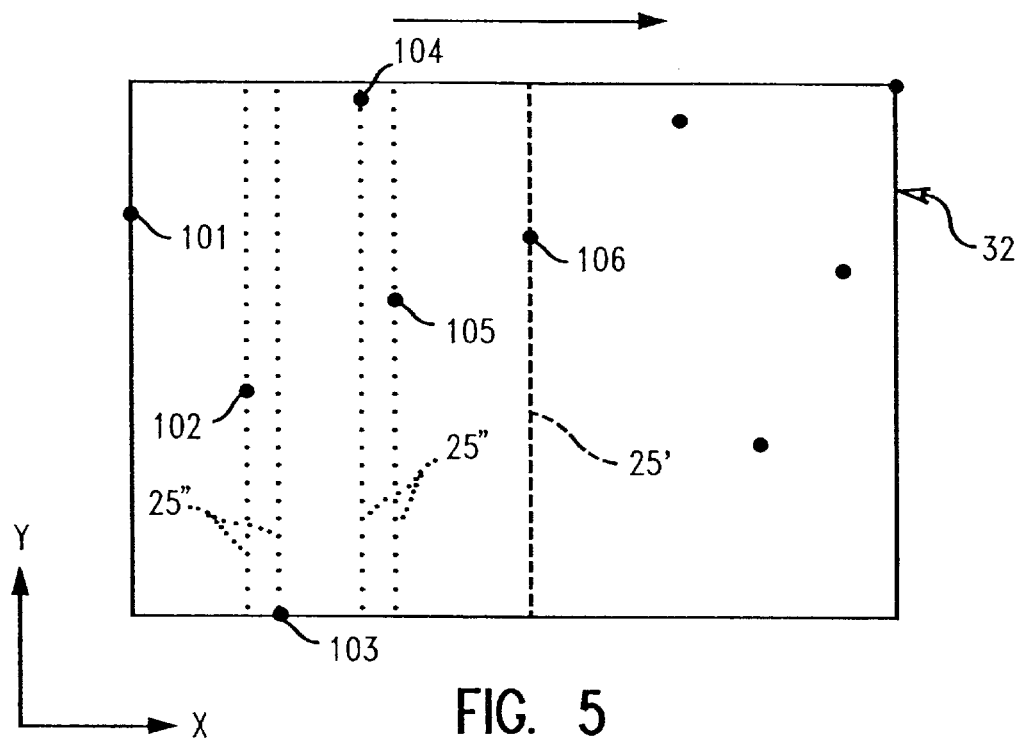
FIG. 5 is a top plan view showing the scanning of points of the isothetic rectangle of FIG. 4 by a vertical scan line to divide it into two isothetic rectangles having minimum area, in accordance with the preferred embodiment of the present invention.
Figure 6:
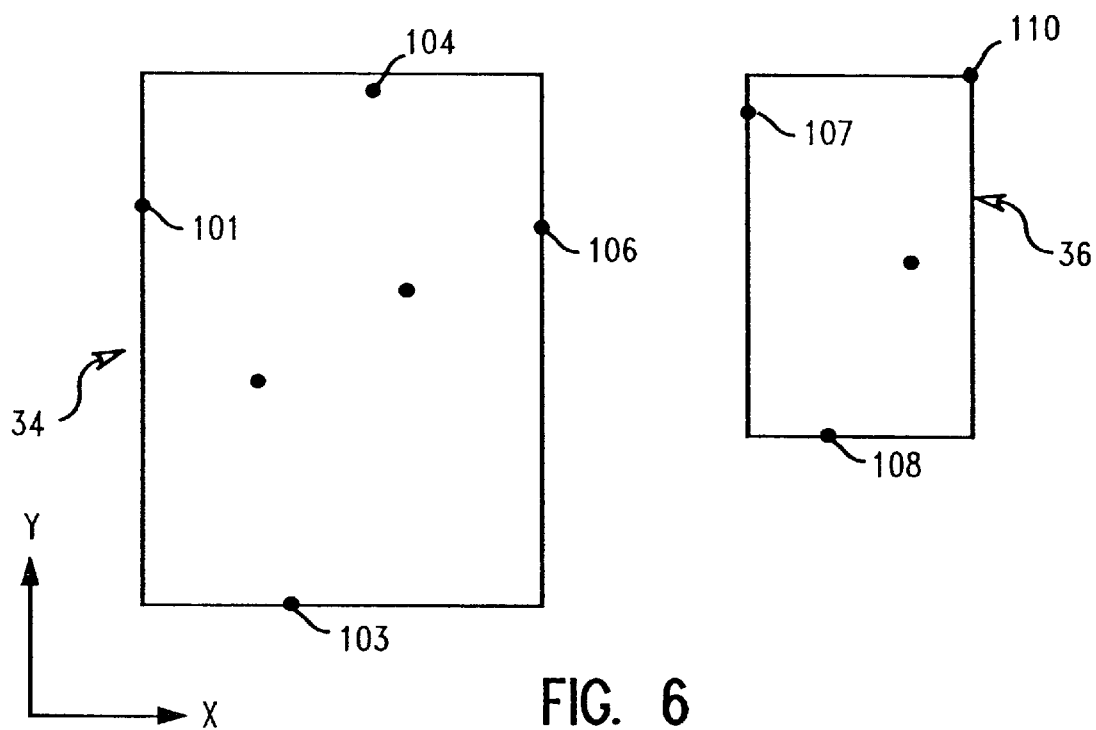
FIG. 6 is a top plan view showing the result of the vertical scanning of points in FIG. 5 creating two isothetic rectangles having minimum area.

Preferably, the n points are scanned from left to right, one at a time, to find the best partition for the vertical separating line. The X and Y-coordinate values are determined for each of the n points. For scanning the points from left to right, the points are first sorted by their X-coordinate value, and the scan line preferably traverses only the Hanan grid created by the given points. The scanning proceeds one point at a time by following the sorted order of X-coordinates from the smallest value to the largest. (FIG. 5.) It suffices to consider discrete locations of scan lines that coincide with Hanan grid lines so that, at each point of the scan line, the points are partitioned into two sets. The first partition contains the points that are to the left and on the scan line. The second partition contains the points that are to the right of the scan line. The smallest bounding box is determined for each of these partitions. (FIG. 6.) When the left to right scanning is completed, there is selected among all the 2-partitions considered the pair with the smallest total area. This presents the best solution, i.e., minimum total area, with vertical scanning or partitioning lines.

Figure 7:
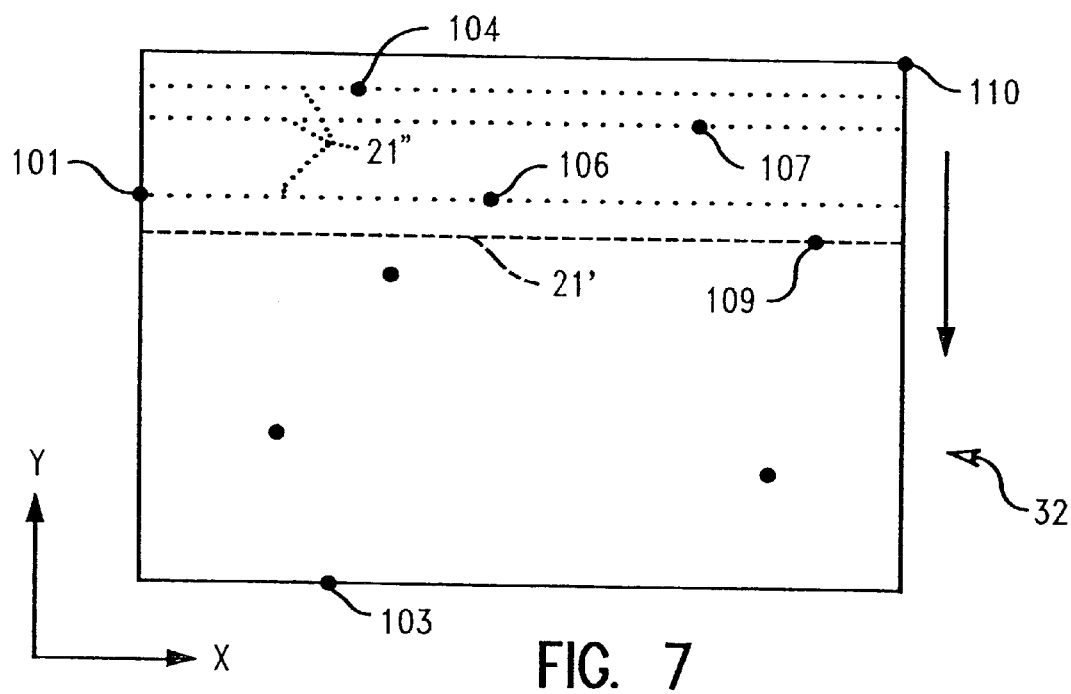
FIG. 7 is a top plan view showing the scanning of points of the isothetic rectangle of FIG. 4 by a horizontal scan line to divide it into two isothetic rectangles having minimum area, in accordance with the preferred embodiment of the present invention.
Figure 8:
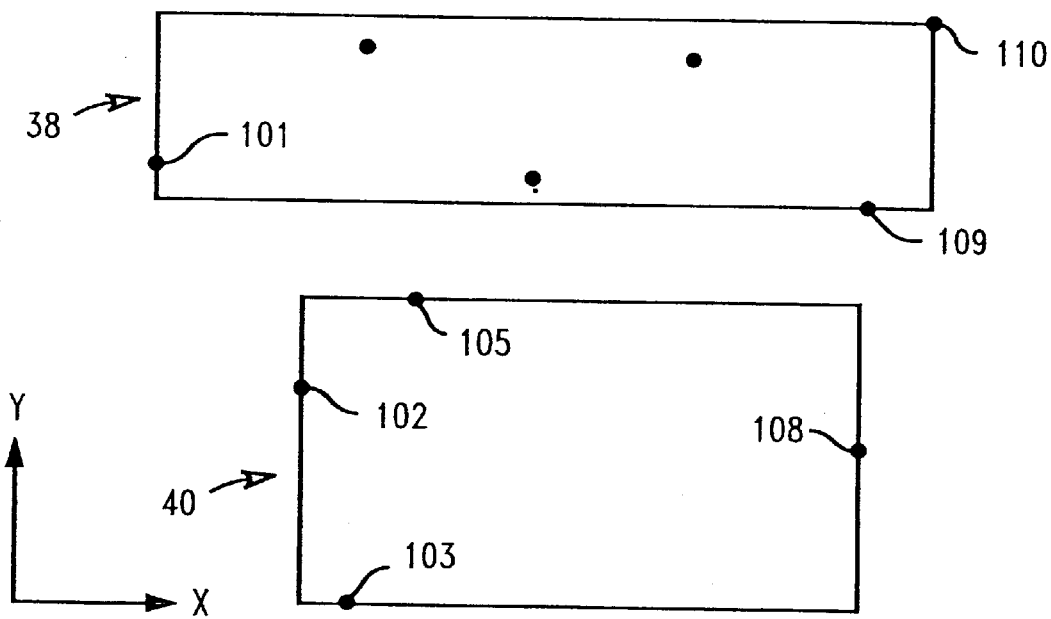
FIG. 8 is a top plan view showing the result of the horizontal scanning of points in FIG. 7 creating two isothetic rectangles having minimum area.

All of the points are again scanned from bottom to top, one at a time, to find the best horizontal separating line. In a manner analogous to the vertical line scanning, the points are sorted by their Y-coordinate value and scanned from top to bottom one point at a time in the sorted order of their Y-coordinates. (FIG. 7.) For each horizontal scan line, there are formed two sets of points, with the first set containing the points above and on the horizontal scan line, and the second set containing the points below the horizontal scan line. For each of these partitions, the smallest bounding box (isothetic rectangle) is determined. (FIG. 8.) From among all the pair of rectangles generated by the horizontal scan lines, the pair of rectangles with the smallest total area are chosen.

After the horizontal scanning and the vertical scanning are completed, there are left two pairs of rectangles—the first pair generated by the vertical scan line and the second pair generated by the horizontal scan line. The total area of each pair is measured, and the pair with the smaller total area is selected as the solution to minimize the area.

Figure 3:
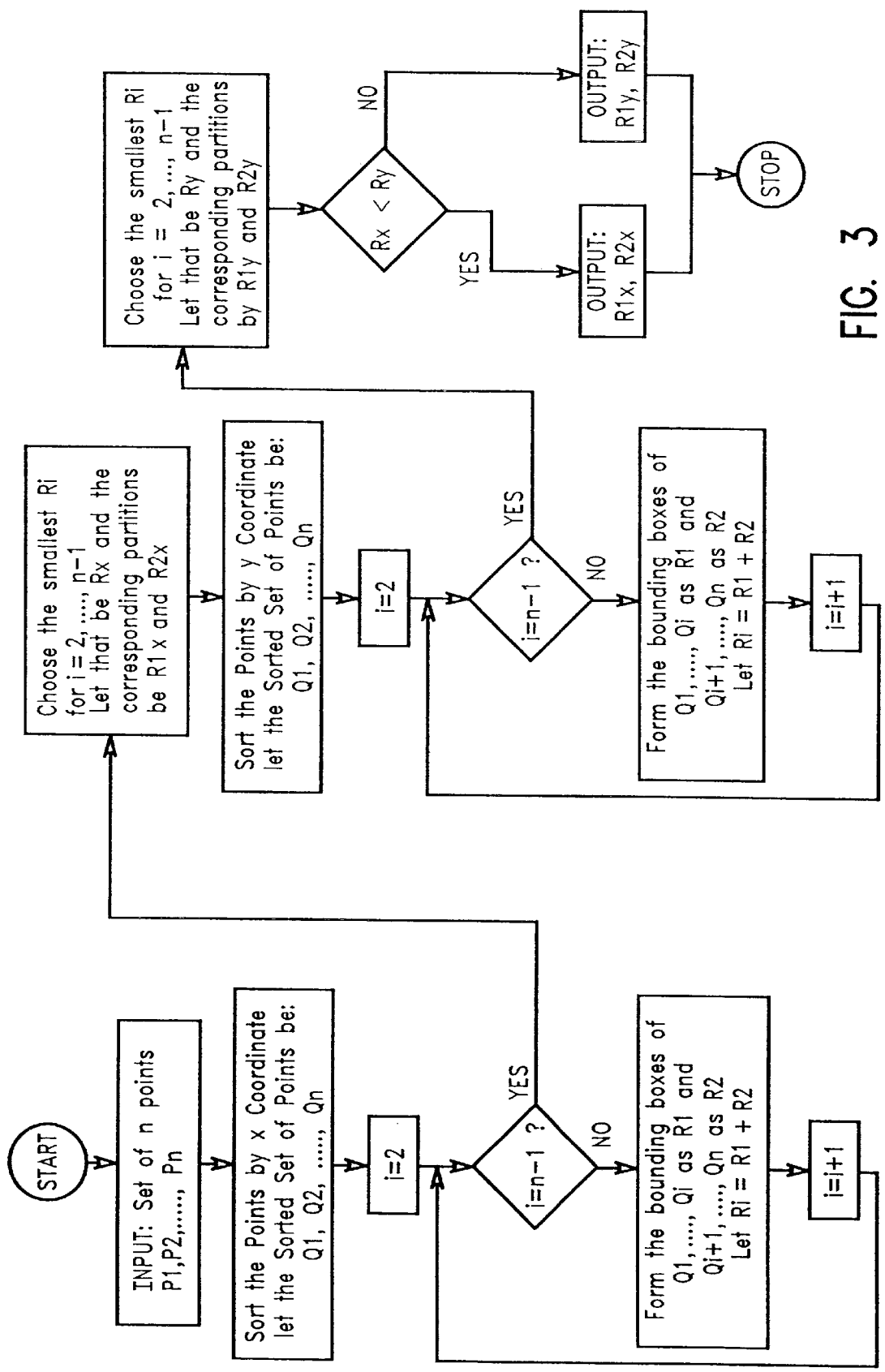
FIG. 3 is a flow chart of another portion of the steps employed to practice the preferred embodiment of the method of the present invention.

The steps of the aforementioned scanning method are shown in FIG. 3. This method is then extended for the p-partition problem, with a greedy method. In the aforedescribed method for the 2-partition the objective function can be stated as either i) minimizing the sum of the area of the two rectangles, or ii) maximizing the area of the difference between the total area of the previous bounding box and the sum of the area of the two rectangles created therefrom. While both of the these objective functions are equivalent, it may be easier to understand the greedy method of the present invention if one considers the second objective function, i.e., maximizing the area of the difference between the total area of the bounding box and the sum of the area of all the p rectangles. Each of the greedy method steps attempts to add to this difference the maximum area that we can add to the area of difference between the total area of the bounding box and the sum of the area of all the computed rectangles.

In the subsequent p-partitioning of the rectangles collectively containing all of the n points, the approach of the 2-partitioning method is utilized at every greedy step until one arrives at p rectangles. In each step, one of the created rectangles is partitioned into two so that it adds maximum area to the difference described above. At the kth step, where, k varies from 2 to p, each of the k rectangles are partitioned into two non-intersecting rectangles, leaving the rest, k−1, rectangles unchanged. After this is completed there are k sets of rectangles, with each set of rectangles consisting of k+1 rectangles. However, in determining the partitions of each rectangle, it is important to note that in accordance with the preferred embodiment of the present invention a rectangle should not be partitioned into two if it has fewer than four distinct points. Among these sets of rectangles, the set containing the pair of rectangles with the smallest total area is selected, as described in the algorithm given below:

Rectilinear p-Partition of n Points ($A_n$,p)
Input: $A_n$: an array of n points
  Integer p
Output: Rectangles: $R_1, R_2, \ldots, R_p$
  1. Find the bounding box of all points in $A_n$. Call it $R_1$
  2. For I=2 to p do in increment of 1
    a) Find the 2-Partitions for Rectangle $R_1, \ldots, R_i$, if possible.
    b) For j=1 to I in increments of 1 do
      i. Find the 2-Partitions for Rectangle $R_j$ as $R_{j1}$ and $R_{j2}$, respectively.
      ii. Find the difference $A_j$=Area ($R_{j1}$)+Area ($R_{j2}$)
    c) Find k such that $A_k$=min $\{A_1, A_2, \ldots, A_i\}$
    d) Assign $R_k=R_{k1}$ and $R_{i+1}+R_{k2}$
  3. Output $R_1, R_2, \ldots, R_p$.

Figure 2:
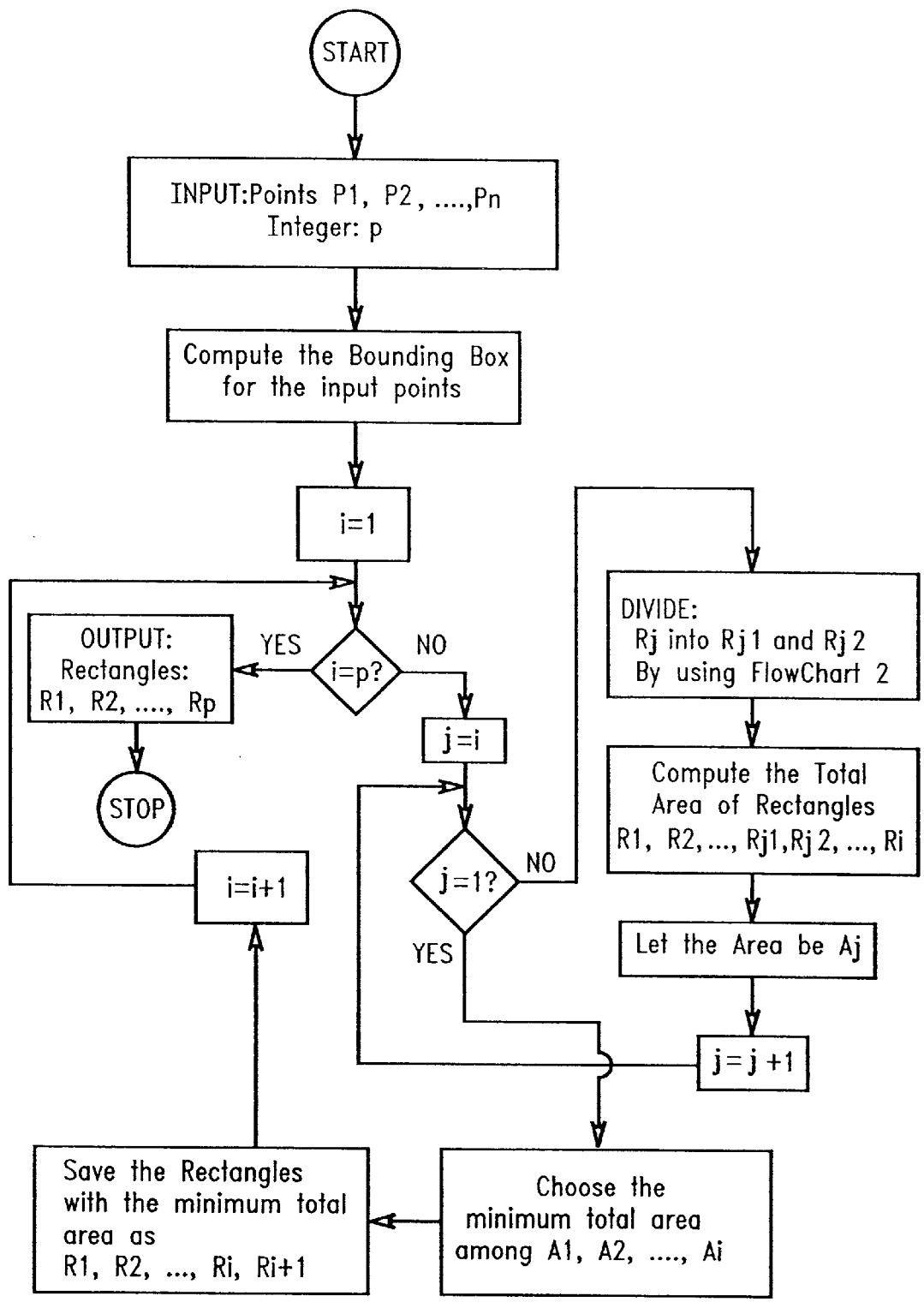
FIG. 2 is a flow chart of a portion of the steps employed to practice the preferred embodiment of the method of the present invention.

In general, the complexities of the algorithm used in the present invention is O(n log n) for time and O(n) for space. The time complexity of the above algorithm is O($n^3$). This algorithm is shown in the form of a flowchart in FIG. 2 and FIG. 3. The solution to the 2-partition problem described above is shown in FIG. 3, and forms the basis of the solution to the p-partition problem as shown in FIG. 2.

For a 1, 2, or 3 way partitioning problem, the above algorithm may be readliy coded into a procedure called BasePartition (R,p), where R is a set of points and p is the number of partitions (p=1, 2, or 3). The output of the algorithm will be a set of p rectangles, denoted as:
  BasePartition(R,p).rectangles[i],
with i ranging from 1 to p. The above algorithm can be extended to greater than 3 partitions. However, extending it trivially would cause the time complexity to explode (i.e., becoming O($n^p$ log n)) and, therefore, an alternative approach is preferred. It is believed that the above algorithm that have been described for two- or three-partitioning is exactly optimal. This follows from the property of sliceability of any two- or three-partition of a planar point set. However, when more than three partitions are made, the partitions are not guaranteed to be sliceable and a greedy algorithm which generates only sliceable partitions is not guaranteed to be optimal.

Figure 4:
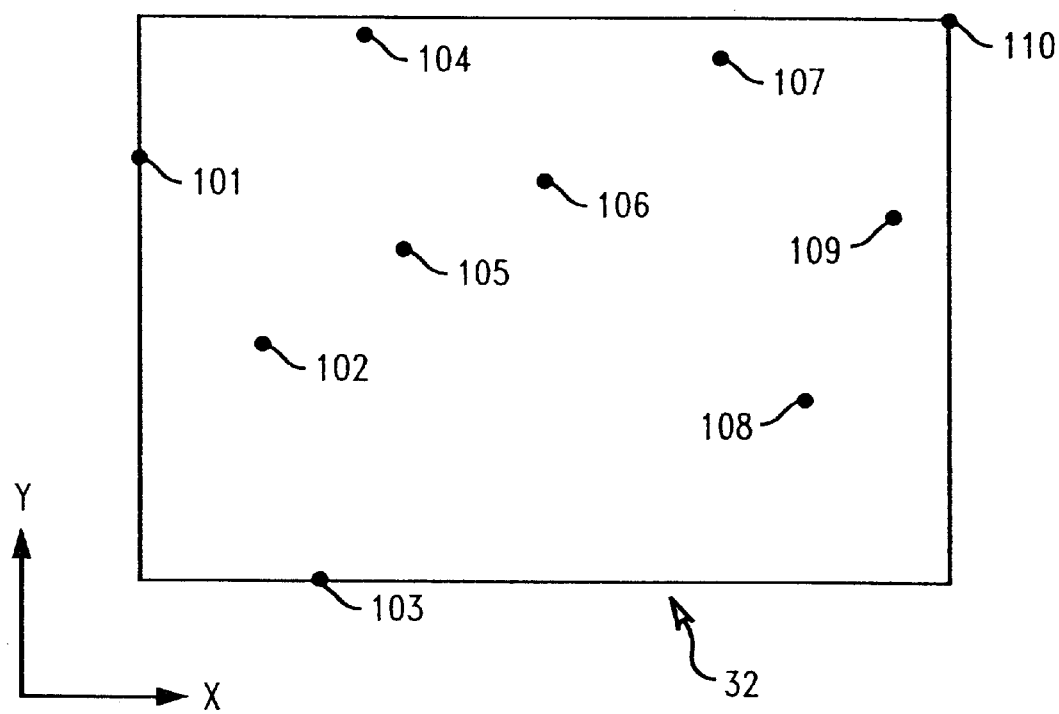
FIG. 4 is a top plan view of an isothetic rectangle forming a bounding box containing all of the n points representing components of an integrated circuit with respect to a coordinate system having a horizontal axis and a vertical axis.

An example of the preferred method of configuring partitions for different circuit or other operational areas on an integrated circuit is shown in FIGS. 4–13. FIG. 4 shows a set of 10 points (i.e., n=10) 101–110 and their bounding box 32. The computation of the bounding box as an isothetic rectangle may be obtained by determining the smallest and the largest X- and Y-coordinates of the given points. In the next stage, the same point set is divided into two rectangles. The first step in this is by scanning the points using a vertical line, i.e., a line parallel to the Y-axis, as shown in FIG. 5. One vertical scan line 25' is shown as a dashed line. All previous vertical scan lines 25" are shown as dotted lines. The movement of the scan line is from left to right as shown by the arrow above.

For each such vertical scan line there are formed two rectangles 34, 36 as shown in FIG. 6, with the points on the left of the scan line forming the left rectangle 34 and with the points on the right of the scan line forming the right rectangle 36. The points on the scan line itself must be incorporated into either the right or left rectangle. As shown, this point 106 is incorporated into the left rectangle 34. Once all of the sets of the rectangles have been computed with the vertical scan lines as shown in FIG. 5, the same is done with horizontal scan lines as shown in FIG. 7. A horizontal scan line 21' is shown as the dashed line, and all previous horizontal scan lines 21" are shown as dotted lines. The movement of the scan line 21' is from top to bottom as shown by the arrow to the right. FIG. 8 shows a corresponding 2partition by the horizontal scan line. Finally, among all the vertical partitioned rectangles 34, 36 (FIG. 6) and horizontal partitioned rectangles 38, 40 (FIG. 8) there is chosen the pair with the minimum total area. In this example this pair happens to be the pair of rectangles 34, 36 shown in FIG. 6.

Figure 9:
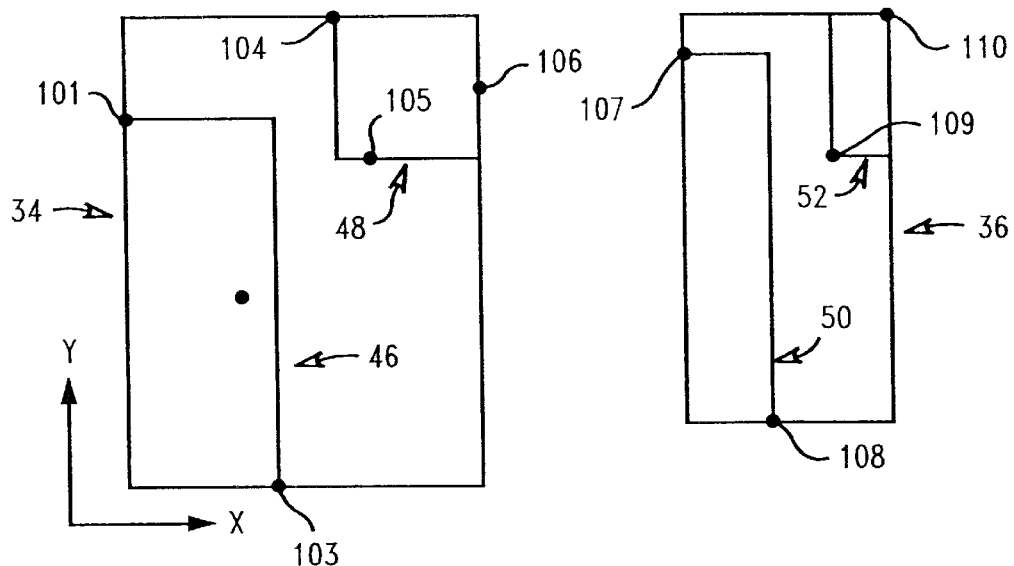
FIG. 9 is a top plan view showing the division of each of the isothetic rectangles of FIG. 6, previously determined to have the minimum area, into two other rectangles having minimum area in accordance with the preferred embodiment of the present invention.
Figure 10:
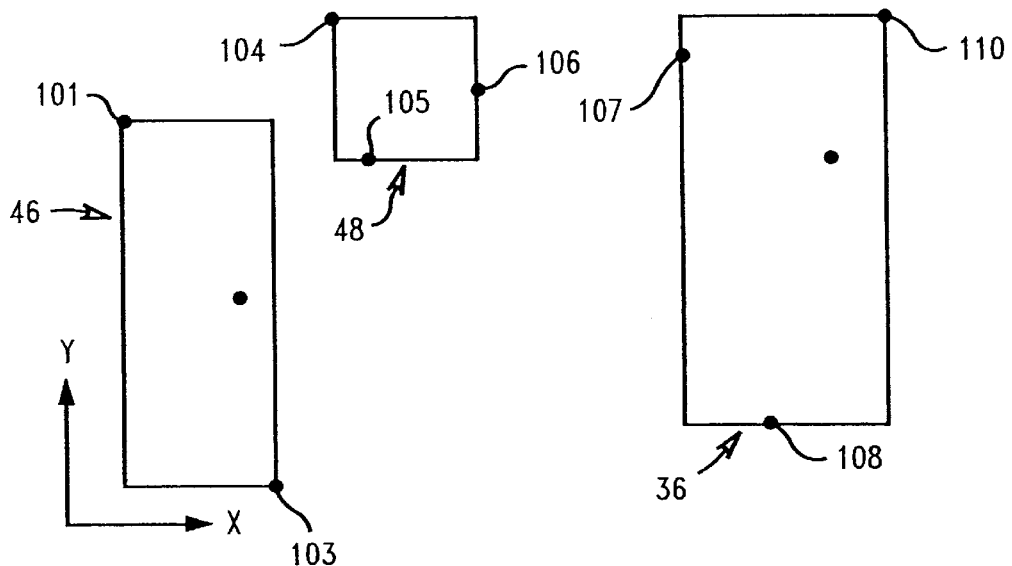
FIG. 10 is a top plan view showing the result of the division of rectangles in FIG. 9, creating from the left hand rectangle two isothetic rectangles having minimum area, and maintaining the size of the right hand rectangle.
Figure 11:
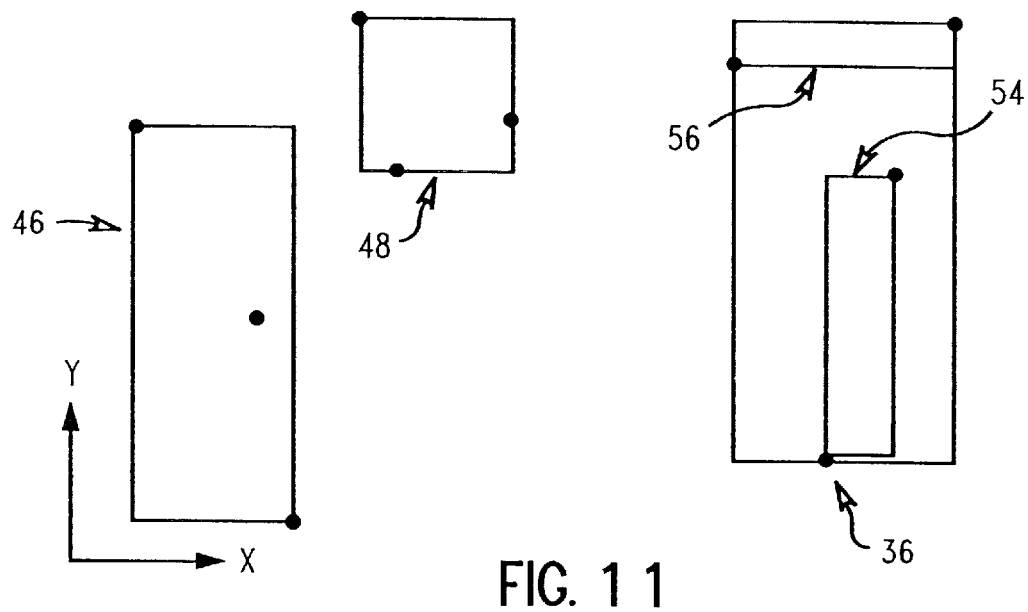
FIG. 11 is a top plan view showing the division of the right hand isothetic rectangle of FIGS. 9 and 10, into two other rectangles having minimum area in accordance with the preferred embodiment of the present invention.
Figure 12:
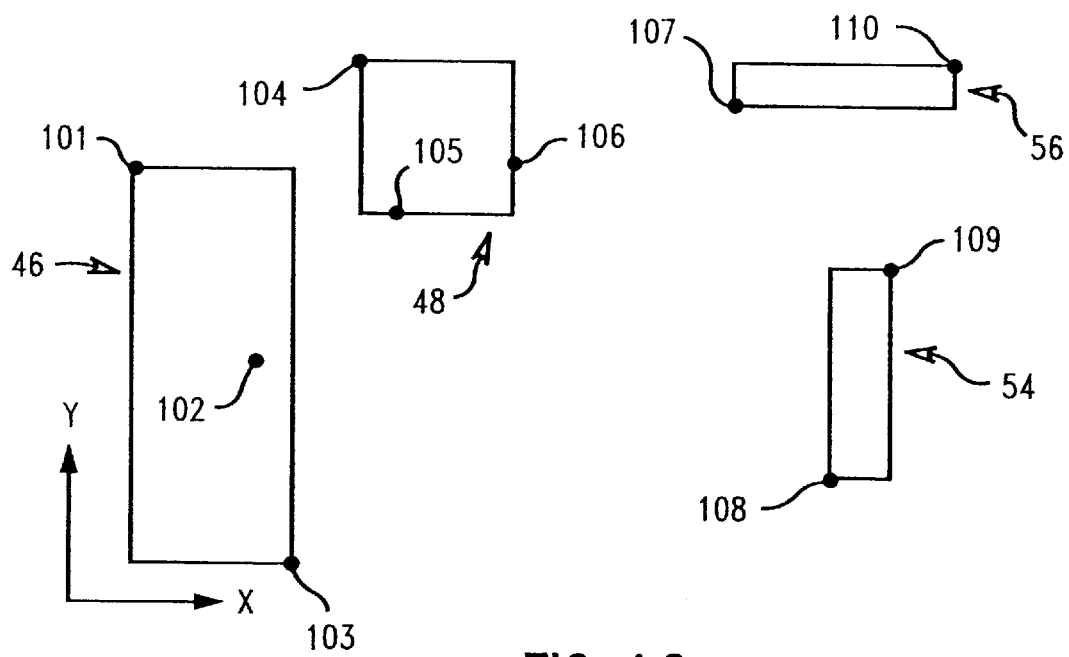
FIG. 12 is a top plan view showing the result of the division of rectangles in FIG. 11, creating from the right hand rectangle two isothetic rectangles having minimum area, along with the left hand rectangles having minimum area shown in 10 and 11.

In the next stage of the method of the present invention, this pair of rectangles 34, 36 is scanned to find the best 3-partition. In doing so, each of the rectangles is divided into a pair of rectangles by the 2 partition scanning method described above. The result is shown in FIG. 9, wherein rectangle 34 is partitioned into rectangles 46, 48 and rectangle 36 is partitioned into rectangles 50, 52. After determining the partition of the left rectangle in FIG. 9 into two minimum area rectangles 46, 48, the result of this 3-partition is shown in FIG. 10. Then, the rectangle 36 on the right in FIG. 10 is partitioned into two parts having minimum area to obtain the 4-partition. The two left rectangles in FIG. 10 cannot be partitioned any further since they have less than 4 points. For the rectangle 36 on the right there are two possible partitions: one with a horizontal scan line resulting in rectangles 54, 56 as shown in FIG. 11, and the other with the vertical scan line resulting in rectangles 50, 52 as shown in FIG. 9. The minimum area is determined to be the rectangles 54, 56 formed with the horizontal scan line, as shown in FIG. 12, which shows the final 4-partition. This final partition results in rectangle 46 containing points 101, 102, 103, rectangle 48 containing points 104, 105, 106, rectangle 54 containing points 108, 109 and rectangle 56 containing points 107, 110.

Figure 13:
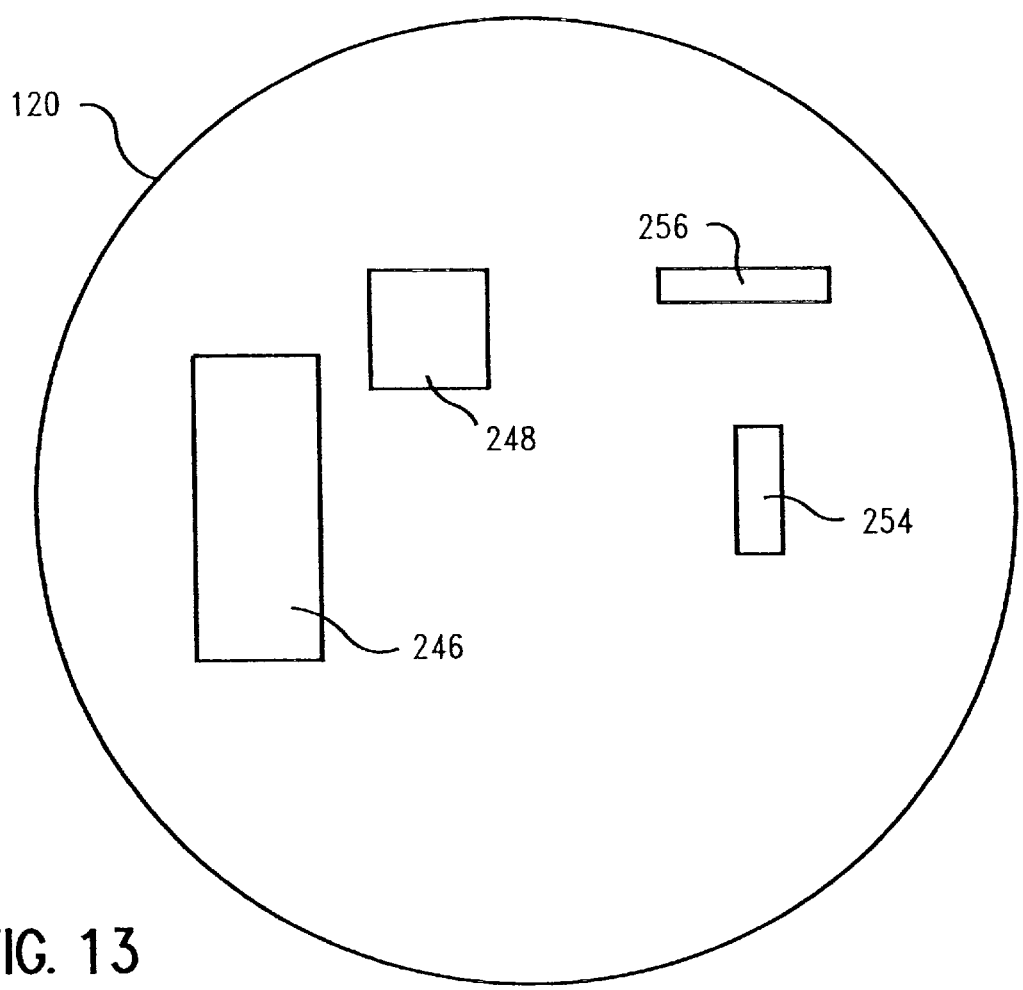
FIG. 13 is a top plan view of an integrated circuit substrate showing the configuration of the operational areas on the integrated circuit in conformance with the isothetic rectangular sub-partitions determined to have the minimum area as shown in FIG. 12.
Figure 14:
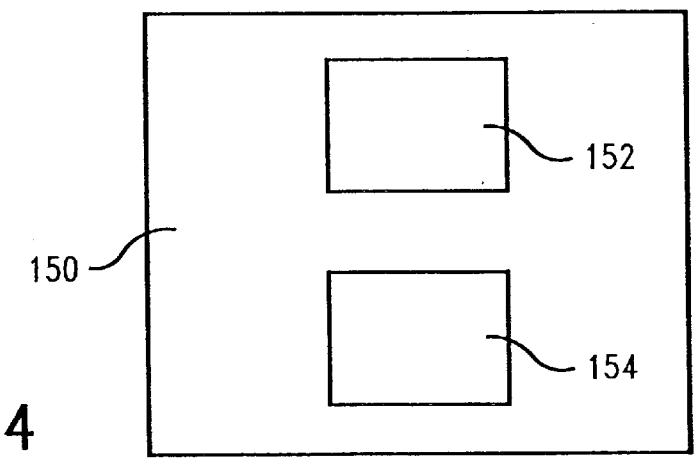
FIG. 14 is a schematic of the system of the present invention employing a computer program to practice the preferred method for configuring partitions for different circuit or other operational areas on an integrated circuit.

FIG. 13 shows an integrated circuit substrate 120 superimposed with the partitions 246, 248, 254, 256 having the same configuration as those of FIG. 12 determined in accordance with the method of the present invention. Partitions 246, 248, 254, 256 contain different circuit or other operational areas on an integrated circuit 120. In configuring such integrated circuits and operational areas, the method of the present invention may be embodied as a computer program product stored on a program storage device. This program storage device may be devised, made and used as a component of a machine utilizing optics, magnetic properties and/or electronics to perform the method steps of the present invention. Program storage devices include, but are not limited to, magnetic disks or diskettes, magnetic tapes, optical disks, Read Only Memory (ROM), floppy disks, semiconductor chips and the like. A computer readable program code means in known source code may be employed to convert the methods described below for use on a computer. The computer program or software incorporating the process steps and instructions described further below may be stored in any conventional computer, for example, that shown in FIG. 14. Computer 150 incorporates a program storage device 152 and a microprocessor 154. Installed on the program storage device 152 is the program code incorporating the method of the present invention, as well as any database information used in designing the integrated circuit chip.

Thus, the present invention provides an improved method and system for designing and configuring partitions on an integrated circuit or other substrate, and is particularly useful in improving the speed of complex VLSI design-automation algorithms in partitioning integrated circuits. The method and system of the present invention creates integrated circuit partitions that minimize the total area of the partitions. The present invention provides advantages over prior art solution methods in that it does not require that the partition areas be squares. In the present invention, non-square rectangles may be employed as partitions. Also, the partition areas do not intersect or abut one another in the present invention, since that would essentially make the regions electrically connected.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of configuring partitions or different circuit or other operational areas on an integrated circuit comprising:

identifying points representing components of an integrated circuit with respect to a coordinate system having a horizontal axis and a vertical axis;

creating a first isothetic rectangular partition containing all of the identified points of the integrated circuit, the isothetic rectangular partition having sides parallel to the horizontal axis and the vertical axis;

subdividing the first isothetic rectangular partition with respect to the horizontal axis by creating a plurality of isothetic rectangular sub-partitions collectively containing all of the identified points of the integrated circuit, each of the isothetic rectangular sub-partitions containing at least two points not aligned in parallel to the horizontal axis, each of the isothetic rectangular sub-partitions being separated by a line parallel to the horizontal axis, the isothetic rectangular sub-partitions collectively encompassing a minimum area containing all of the identified points;

subdividing the first isothetic rectangular partition with respect to the vertical axis by creating a plurality of isothetic rectangular sub-partitions collectively containing all of the identified points of the integrated circuit, each of the isothetic rectangular sub-partitions containing at least two points not aligned in parallel to the vertical axis, each of the isothetic rectangular sub-partitions being separated by a line parallel to the vertical axis, the isothetic rectangular sub-partitions collectively encompassing a minimum area containing all of the identified points;

comparing the collective area of the isothetic rectangular sub-partitions subdivided with respect to the horizontal axis to the collective area of the isothetic rectangular sub-partitions subdivided with respect to the vertical axis;

determining which of the horizontally divided or vertically divided isothetic rectangular sub-partitions have the smaller area; and configuring the operational area on the integrated circuit in conformance with the isothetic rectangular sub-partitions determined to have the smaller area.

2. The method of claim 1 wherein subdividing the first isothetic rectangular partition with respect to the horizontal or vertical axis is by:

creating a plurality of sets of two isothetic rectangular sub-partitions, the isothetic rectangular sub-partitions in each set being separated by a line parallel to either the horizontal axis or the vertical axis, respectively, and collectively containing all of the identified points of the integrated circuit;

for each set, determining the total area of the isothetic rectangular sub-partitions in the set; and selecting the set of isothetic rectangular sub-partitions having the smallest total area.

3. The method of claim 2 wherein a set of isothetic rectangular sub-partitions having the smallest total area is selected with respect to the horizontal axis and a set of isothetic rectangular sub-partitions having the smallest total area is selected with respect to the vertical axis, and wherein the selected sets are compared to determine which of the horizontally divided or vertically divided isothetic rectangular sub-partitions have the smaller area.

4. The method of claim 2 wherein the two isothetic rectangular sub-partitions created in each set do not intersect.

5. The method of claim 2 including further partitioning at least one of the isothetic rectangular sub-partitions in the set determined to have the smaller area by:

creating a plurality of subsets of two isothetic rectangular sub-partitions, the isothetic rectangular sub-partitions in each subset being separated by a line parallel to either the horizontal axis or the vertical axis and collectively containing all of the identified points of the isothetic rectangular sub-partition being further partitioned;

for each subset, determining the total area of the isothetic rectangular sub-partitions in the subset; and selecting the subset of isothetic rectangular sub-partitions having the smallest total area.

6. The method of claim 5 wherein the further partitioning is continued on one or more isothetic rectangular sub-partitions until a desired number of isothetic rectangular sub-partitions having the smallest total area are selected.

7. The method of claim 5 wherein only isothetic rectangular sub-partitions containing at least four identified points are partitioned.

8. The method of claim 2 wherein subdividing the isothetic rectangular partition with respect to the horizontal or vertical axis is by scanning the identified points with a line parallel to the horizontal axis or a line parallel to the vertical axis, respectively, and, for different scanning line positions, creating a set of two separate, non-intersecting isothetic rectangular boxes on either side of the line collectively containing all of the identified points.

9. The method of claim 1 including:
i) calculating the difference in area between the first isothetic rectangular partition containing all of the identified points of the integrated circuit with the collective area of the isothetic rectangular sub-partitions subdivided with respect to the horizontal axis, and
ii) calculating the difference in area between the first isothetic rectangular partition containing all of the identified points of the integrated circuit with the collective area of the isothetic rectangular sub-partitions subdivided with respect to the vertical axis to determine which of the horizontally divided or vertically divided isothetic rectangular sub-partitions have the smaller area.

10. The method of claim 1 wherein the identified points represent components of an integrated circuit selected from the group consisting essentially of terminals, connector corners and vias.

11. The method of claim 1 wherein the operational area on the integrated circuit is configured to create a local net in each of the selected rectangular sub-partitions.

12. The method of claim 1 wherein the operational area on the integrated circuit is configured to create a fill pattern in each of the selected rectangular sub-partitions.

13. The method of claim 1 wherein the operational area on the integrated circuit is configured to create a local area of similar power supply voltage in each of the selected rectangular sub-partitions.

14. The method of claim 1 wherein two isothetic rectangular sub-partitions are created in the step of subdividing the first isothetic rectangular partition with respect to the vertical axis and the step of subdividing the first isothetic rectangular partition with respect to the horizontal axis.

15. A method of locating circuit areas on an integrated circuit comprising:
a) identifying points representing components of an integrated circuit with respect to a coordinate system having a horizontal axis and a vertical axis;
b) creating a first isothetic rectangular partition containing all of the identified points of the integrated circuit, the isothetic rectangular partition having sides parallel to the horizontal axis and the vertical axis;
c) scanning the identified points with a line parallel to the horizontal axis, and, for different horizontal scanning line positions, creating a set of two separate, non-intersecting isothetic rectangular sub-partitions on either side of the line collectively containing all of the identified points;
d) measuring the total area of each set of isothetic rectangular sub-partitions created at each horizontal scanning line position;
e) selecting the set of horizontally scanned isothetic rectangular sub-partitions having the smallest total area;
f) scanning the identified points with a line parallel to the vertical axis, and, for different vertical scanning line positions, creating a set of two separate, non-intersecting isothetic rectangular sub-partitions on either side of the line collectively containing all of the identified points;
g) measuring the total area of each set of isothetic rectangular sub-partitions created at each vertical scanning line position;
h) selecting the set of vertically scanned isothetic rectangular sub-partitions having the smallest total area;
i) comparing the set of horizontally scanned isothetic rectangular sub-partitions having the smallest total area to the set of vertically scanned isothetic rectangular sub-partitions having the smallest total area and determining the set of scanned isothetic rectangular sub-partitions having the smaller area; and
j) locating circuit areas on the integrated circuit in conformance with the set of scanned isothetic rectangular sub-partitions determined to have the smaller area.

16. The method of claim 15 wherein, in step (c), each of the two created isothetic rectangular sub-partitions contains at least two points not aligned in parallel to the horizontal axis and, in step (f), each of the two created isothetic rectangular sub-partitions contains at least two points not aligned in parallel to the vertical axis.

17. The method of claim 15 wherein steps (c) through (i) determine a first generation set of scanned isothetic rectangular sub-partitions having minimum area, and further repeating steps (c) through (i) on the scanned isothetic rectangular sub-partitions to create one or more subsequent generation sets of scanned isothetic rectangular sub-partitions having minimum area, and locating circuit areas on the integrated circuit in conformance with a subsequent generation set of scanned isothetic rectangular sub-partitions determined having minimum area.

18. The method of claim 17 wherein only isothetic rectangular sub-partitions containing at least four identified points are scanned.

19. The method of claim 15 including calculating the difference in area between the first isothetic rectangular partition containing all of the identified points of the integrated circuit with the collective area of the scanned isothetic rectangular sub-partitions to select the set of scanned isothetic rectangular sub-partitions having the smallest total area.

20. A computer program product comprising a computer usable medium having computer readable program code means embodied therein for configuring partitions for different circuit or other operational areas on an integrated circuit, the computer readable program code means in said computer usable medium comprising:
computer readable program code means for identifying points representing components of an integrated circuit with respect to a coordinate system having a horizontal axis and a vertical axis;

computer readable program code means for creating a first isothetic rectangular partition containing all of the identified points of the integrated circuit, the isothetic rectangular partition having sides parallel to the horizontal axis and the vertical axis;

computer readable program code means for subdividing the first isothetic rectangular partition with respect to the horizontal axis by creating a plurality of isothetic rectangular sub-partitions collectively containing all of the identified points of the integrated circuit, each of the isothetic rectangular sub-partitions containing at least two points not aligned in parallel to the horizontal axis, each of the isothetic rectangular sub-partitions being separated by a line parallel to the horizontal axis, the isothetic rectangular sub-partitions collectively encompassing a minimum area containing all of the identified points;

computer readable program code means for subdividing the first isothetic rectangular partition with respect to the vertical axis by creating a plurality of isothetic rectangular sub-partitions collectively containing all of the identified points of the integrated circuit, each of the isothetic rectangular sub-partitions containing at least two points not aligned in parallel to the vertical axis, each of the isothetic rectangular sub-partitions being separated by a line parallel to the vertical axis, the isothetic rectangular sub-partitions collectively encompassing a minimum area containing all of the identified points;

computer readable program code means for comparing the collective area of the isothetic rectangular sub-partitions subdivided with respect to the horizontal axis to the collective area of the isothetic rectangular sub-partitions subdivided with respect to the vertical axis;

computer readable program code means for determining which of the horizontally divided or vertically divided isothetic rectangular sub-partitions have the smaller area; and computer readable program code means for configuring the operational area on the integrated circuit in conformance with the isothetic rectangular sub-partitions determined to have the smaller area.

21. A computer program product comprising a computer usable medium having computer readable program code means embodied therein for locating circuit areas on an integrated circuit, the computer readable program code means in said computer usable medium comprising:

computer readable program code means for identifying points representing components of an integrated circuit with respect to a coordinate system having a horizontal axis and a vertical axis;

computer readable program code means for creating a first isothetic rectangular partition containing all of the identified points of the integrated circuit, the isothetic rectangular partition having sides parallel to the horizontal axis and the vertical axis;

computer readable program code means for scanning the identified points with a line parallel to the horizontal axis, and, for different horizontal scanning line positions, creating a set of two separate, non-intersecting isothetic rectangular sub-partitions on either side of the line collectively containing all of the identified points;

computer readable program code means for measuring the total area of each set of isothetic rectangular sub-partitions created at each horizontal scanning line position;

computer readable program code means for selecting the set of horizontally scanned isothetic rectangular sub-partitions having the smallest total area;

computer readable program code means for scanning the identified points with a line parallel to the vertical axis, and, for different vertical scanning line positions, creating a set of two separate, non-intersecting isothetic rectangular sub-partitions on either side of the line collectively containing all of the identified points;

computer readable program code means for measuring the total area of each set of isothetic rectangular sub-partitions created at each vertical scanning line position;

computer readable program code means for selecting the set of vertically scanned isothetic rectangular sub-partitions having the smallest total area;

computer readable program code means for comparing the set of horizontally scanned isothetic rectangular sub-partitions having the smallest total area to the set of vertically scanned isothetic rectangular sub-partitions having the smallest total area and determining the set of scanned isothetic rectangular sub-partitions having the smaller area; and computer readable program code means for locating circuit areas on the integrated circuit in conformance with the set of scanned isothetic rectangular sub-partitions determined to have the smaller area.

22. A program storage device readable by a machine, tangibly embodying a program of instructions executable by the machine to perform method steps for configuring partitions for different circuit or other operational areas on an integrated circuit, said method steps comprising:

identifying points representing components of an integrated circuit with respect to a coordinate system having a horizontal axis and a vertical axis;

creating a first isothetic rectangular partition containing all of the identified points of the integrated circuit, the isothetic rectangular partition having sides parallel to the horizontal axis and the vertical axis;

subdividing the first isothetic rectangular partition with respect to the horizontal axis by creating a plurality of isothetic rectangular sub-partitions collectively containing all of the identified points of the integrated circuit, each of the isothetic rectangular sub-partitions containing at least two points not aligned in parallel to the horizontal axis, each of the isothetic rectangular sub-partitions being separated by a line parallel to the horizontal axis, the isothetic rectangular sub-partitions collectively encompassing a minimum area containing all of the identified points;

subdividing the first isothetic rectangular partition with respect to the vertical axis by creating a plurality of isothetic rectangular sub-partitions collectively containing all of the identified points of the integrated circuit, each of the isothetic rectangular sub-partitions containing at least two points not aligned in parallel to the vertical axis, each of the isothetic rectangular sub-partitions being separated by a line parallel to the vertical axis, the isothetic rectangular sub-partitions collectively encompassing a minimum area containing all of the identified points;

comparing the collective area of the isothetic rectangular sub-partitions subdivided with respect to the horizontal axis to the collective area of the isothetic rectangular sub-partitions subdivided with respect to the vertical axis; determining which of the horizontally divided or vertically divided isothetic rectangular sub-partitions have the smaller area; and configuring the operational area on the integrated circuit in conformance with the isothetic rectangular sub-partitions determined to have the smaller area.

23. A program storage device readable by a machine, tangibly embodying a program of instructions executable by the machine to perform method steps for locating circuit areas on an integrated circuit, said method steps comprising:

a) identifying points representing components of an integrated circuit with respect to a coordinate system having a horizontal axis and a vertical axis;

b) creating a first isothetic rectangular partition containing all of the identified points of the integrated circuit, the isothetic rectangular partition having sides parallel to the horizontal axis and the vertical axis;

c) scanning the identified points with a line parallel to the horizontal axis, and, for different horizontal scanning line positions, creating a set of two separate, non-intersecting isothetic rectangular sub-partitions on either side of the line collectively containing all of the identified points;

d) measuring the total area of each set of isothetic rectangular sub-partitions created at each horizontal scanning line position;

e) selecting the set of horizontally scanned isothetic rectangular sub-partitions having the smallest total area;

f) scanning the identified points with a line parallel to the vertical axis, and, for different vertical scanning line positions, creating a set of two separate, non-intersecting isothetic rectangular sub-partitions on either side of the line collectively containing all of the identified points;

g) measuring the total area of each set of isothetic rectangular sub-partitions created at each vertical scanning line position;

h) selecting the set of vertically scanned isothetic rectangular sub-partitions having the smallest total area;

i) comparing the set of horizontally scanned isothetic rectangular sub-partitions having the smallest total area to the set of vertically scanned isothetic rectangular sub-partitions having the smallest total area and determining the set of scanned isothetic rectangular sub-partitions having the smaller area; and j) locating circuit areas on the integrated circuit in conformance with the set of scanned isothetic rectangular sub-partitions determined to have the smaller area.

* * * * *